United States Patent [19]

Bard et al.

[11] Patent Number: 5,008,360

[45] Date of Patent: Apr. 16, 1991

[54] ORGANOSILICON MATERIALS

[75] Inventors: John K. Bard; Julia S. Burnier, both of Wilmington, Del.

[73] Assignee: Hercules Incorporated, Wilmington, Del.

[21] Appl. No.: 422,214

[22] Filed: Oct. 16, 1989

[51] Int. Cl.$^5$ ............................................. C08G 77/04
[52] U.S. Cl. ..................................... 528/25; 528/15; 528/31; 523/222; 524/862
[58] Field of Search ............................ 528/15, 31, 25; 524/862; 523/222

[56] References Cited

U.S. PATENT DOCUMENTS

| | | | |
|---|---|---|---|
| 2,665,287 | 1/1954 | Hatcher | 528/15 |
| 2,823,218 | 2/1958 | Speier et al. | 260/448.2 |
| 3,197,432 | 7/1965 | Lamoreaux | 528/15 |
| 3,197,433 | 7/1965 | Lamoreaux | 528/15 |
| 3,198,766 | 8/1965 | Nitzsche et al. | 528/15 |
| 3,220,972 | 11/1965 | Lamoreaux | 260/46.5 |
| 3,271,362 | 9/1966 | Chalk et al. | 528/15 |
| 3,929,850 | 12/1975 | Streck et al. | 260/448.2 |
| 3,992,427 | 11/1976 | Chandra et al. | 528/15 |
| 4,011,247 | 3/1977 | Sato et al. | 528/31 |
| 4,599,440 | 7/1986 | Watanabe et al. | 556/460 |
| 4,877,820 | 10/1989 | Cowan | 523/222 |
| 4,900,779 | 2/1990 | Leibfried | 523/222 |
| 4,902,731 | 2/1990 | Leibfried | 523/222 |

FOREIGN PATENT DOCUMENTS 0204171 10/1986 European Pat. Off. .
767112 9/1980 U.S.S.R. .

OTHER PUBLICATIONS

Wilhelm Risse et al., "Di-Tetrafunctional Initiators for the Living Ring-Opening Olefin Metathesis Polymerization of Strained Cyclic Olefins", (1989 American Chemical Society), Macromolecules, vol. 22, No. 8, 1989.

Primary Examiner—Melvyn I. Marquis
Attorney, Agent, or Firm—Mark D. Kuller

[57] ABSTRACT

This invention is directed to a prepreg which comprises fiber reinforcement impregnated with the partial hydrosilation reaction product of:

(a) at least one polyene having at least two non-aromatic carbon-carbon double bonds highly reactive in hydrosilation, the carbon-carbon double bonds being either in an alpha, beta or gamma position on a linear carbon moiety, next to two bridgehead positions in a strained polycyclic aliphatic ring structure, or in a cyclobutene ring;

(b) at least one polycyclic polyene having at least two chemically distinguishable non-aromatic, non-conjugated carbon-carbon double bonds in its rings; and (c) at least one cyclic polysiloxane containing three or more ≡SiH groups; which is substantially tack-free.

This invention is also directed to a laminate which is prepared by curing one or more of the prepregs beyond their gel point, and which may be clad with conductive material, and printed circuit boards made from such laminates.

In addition, this invention is directed to crosslinkable prepolymers and crosslinked polymers made from components (a), (b) and (c), wherein at least one of (a) and (b) is not an isomer of tricyclopentadiene.

This invention is further directed to the processes of preparing all of the aforementioned materials.

28 Claims, No Drawings

ORGANOSILICON MATERIALS

This invention is directed to prepregs useful for preparing printed circuit boards. The prepregs are fiber reinforced, substantially tack-free and the partial hydrosilation reaction products of a chain extender (polyene), polycyclic polyene and cyclic polysiloxane. The invention is also directed to laminates made from such prepregs and printed circuit boards made from such prepregs and laminates, as well as certain crosslinkable prepolymers and crosslinked polymers made from the aforementioned components, and the processes of preparing all of these.

BACKGROUND OF THE INVENTION

Printed circuit boards are commonly used to mount and interconnect electronic devices. Circuit boards are generally made from circuit board laminate comprised of a reinforced polymeric material. If subtractive techniques are used to form the interconnection circuitry, the laminate is clad with copper foil or some other suitable conductive material. Different reinforcements are used, including paper and fibers of glass, quartz, aramids, and graphite. The fibers may be used in woven or non-woven form.

The circuit boards used in advanced electronic applications must meet demanding requirements in order to allow for proper performance. The polymers used in the circuit board laminate must have adequate thermal, electrical and physical properties. In high performance applications, properties such as a high glass transition temperature (Tg), a low thermal expansion coefficient, a low dielectric constant and moisture resistance are desirable.

It is also desirable that the processing characteristics of the polymer be suited to conventional processes used in the circuit board industry. Circuit board laminate is typically fabricated from prepregs which comprise reinforcement impregnated with a partially cured prepolymer. Prepreg is typically fabricated using a solution impregnation process. The reinforcement (typically fabric) is passed in a continuous manner through a prepolymer solution and then through an oven in which the solvent is removed. The prepolymer may also be partially cured (advanced) in this oven.

Single and double sided circuit boards make use of circuitry on one or both sides of the laminate. Typically, laminates are formed by stacking individual plies of prepreg and laminating them under heat and pressure in a hydraulic press. If circuitry is to be formed via a subtractive process, a conductive layer, typically copper foil, is laminated to one or both sides of the laminate during this operation. The polymeric portion of the laminate is cured during lamination. Post cure at an elevated temperature may be required to more fully cure the polymer.

Multilayer circuit boards contain circuitry on external and internal layers. Circuitry is formed on one or both sides of thin laminates. These are then bonded together in a second lamination step using prepreg as an adhesive dielectric layer.

A proper prepolymer content (weight percent prepolymer) must be achieved on the prepreg. The prepolymer content is influenced by factors such as the solids content of the solution, the mechanical arrangement of the impregnation device (called a treater), and the viscosity of the resin. Depending on the nature of the reinforcement being used, desirable prepolymer contents may range from about 35% to about 75%. For each specific reinforcement, such as a specific style of woven glass cloth, the prepolymer content must be controllable to within several percent of a specific value in order to allow for proper performance in subsequent processing steps and during circuit board operation. The polymer serves as a dielectric layer and, therefore, there must be sufficient polymer between conductive layers so that the board does not fail during operation. In some instances, the thickness of this dielectric layer affects the electrical performance of the circuit board. Control of prepolymer content is required to control the thickness.

It is desirable in many, but not all, instances that circuit board prepreg be substantially tack-free in order to facilitate handling and avoid contamination. With some compositions, simply removing the solvent during prepreg fabrication yields tack-free prepreg. With others, advancement is required to yield tack-free prepreg.

The prepolymer on the prepreg must also be capable of flowing during lamination. Its melt viscosity must be low enough during lamination to allow for consolidation of the individual prepreg plies into a unified laminate and to allow for elimination of trapped air or volatiles, but not so low that excessive flow occurs. Proper prepolymer flow is of similar importance when a multilayer circuit board is fabricated.

The inventors studied use of the polymers and prepolymers made from polycyclic polyenes (such as dicyclopentadiene) and cyclic siloxanes (such as methylhydrocyclosiloxanes), as described by Leibfried in U.S. patent application Ser. Nos. 07/079,740 filed July 30, 1987, now U.S. Pat. No. 4,900,779 and 07/232,826, filed Aug. 16, 1988, now U.S. Pat. No. 4,902,731, for preparation of prepreg and laminate for printed circuit boards. They discovered that processing characteristics and performance are enhanced by use of a chain extender (component (a) described below), and that hydrosilation compositions comprising a chain extender make excellent prepolymers, prepregs, laminates and polymers for printed circuit boards.

SUMMARY OF THE INVENTION

This invention is directed to a prepreg which comprises fiber reinforcement impregnated with the partial hydrosilation reaction product of:
(a) at least one polyene having at least two non-aromatic carbon-carbon double bonds highly reactive in hydrosilation, the carbon-carbon double bonds being either in an alpha, beta or gamma position on a linear carbon moiety, next to two bridgehead positions in a strained polycyclic aliphatic ring structure, or in a cyclobutene ring;
(b) at least one polycyclic polyene having at least two chemically distinguishable non-aromatic, non-conjugated carbon-carbon double bonds in its rings; and
(c) at least one cyclic polysiloxane containing three or more $\equiv$SiH groups; which is substantially tack-free.

This invention is also directed to laminates which are prepared by curing one or more of the prepregs beyond their gel point, and which may be clad with conductive material, and printed circuit boards made from such laminates.

In addition, this invention is directed to crosslinkable prepolymers and crosslinked polymers made from components (a), (b) and (c), wherein at least one of (a) and (b) is not an isomer of tricyclopentadiene.

This invention is further directed to the processes of preparing all of the aforementioned materials.

DETAILED DESCRIPTION OF THE INVENTION

Herein, the term "prepolymer" refers to any viscous liquid or solid hydrosilation crosslinkable composition that has been partially cured, but has not been cured up to or beyond its gel point (gel point is the point at which a material will no longer flow when heated and is no longer soluble in organic solvents); typically, having 30% to 75% of the available SiH groups reacted.

The first component of this invention is a low molecular weight (typically having a molecular weight less than 500) polyene with at least two carbon-carbon double bonds highly reactive in hydrosilation (they may contain other less reactive (including unreactive) double-bonds, provided that those double bonds do not interfere with the reactivity of the highly reactive double bonds). Preferably, this component has two carbon-carbon double bonds highly reactive in hydrosilation. The carbon-carbon double bonds are either in an alpha, beta or gamma position on a linear carbon moiety which is unsubstituted in the terminal position, in a cyclobutene ring, or next to two bridgehead positions in a strained polycyclic aliphatic ring structure. The former include any diallyl, divinyl or bis-norbornenyl compounds. Linear carbon moieties which have carbon-carbon double bonds in the beta or gamma position useful in this invention are those which react at the terminal carbon atom as if unsaturated at the alpha position. Preferred are carbon moieties which are unsubstituted in the terminal position. 5-Ethylidene-2-norbornene (isomer of 5-vinyl-2-norbornene) is an example of a compound having a linear carbon moiety substituted at the beta position.

Examples of component (a) include 5-vinyl-2-norbornene, o-, m- or p-diisopropenylbenzene, o-, m- or p-divinylbenzene, diallyl ether, diallyl benzene, and any monomer with two or more terminal norbornenyl groups (including isomers of the above fitting with the general definition of component (a)), such as dimethanohexahydronaphthalene (DMHN) or those having the following general formulae:

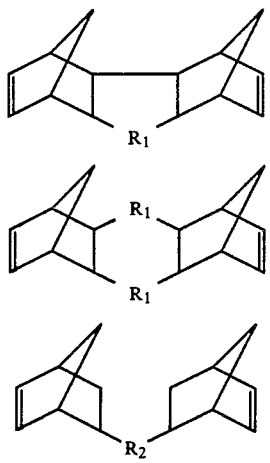

wherein $R_1$, which may be the same or different in formula (II), is selected from $C(R_3)_2$, $Si(R_3)_2$, $Si(R_3)_2—Si(R_3)_2$, $C(R_3)_2—C(R_3)_2$, $CON(R_3)$, $OC=O$, $C(R_3)=N$, $S=O$, $SO_2$, $O$ and $C=O$. $R_3$ is any substituent that, under the hydrosilation conditions used, does not substantially react with SiH or carbon-carbon double bonds, or interfere with hydrosilation catalysis. Illustrative are H (except when $R_3$ is attached to Si), halogen (e.g., Cl, Br, F), aromatic (e.g., aryl, aryloxy, etc.), linear, cyclic or branched aliphatic (e.g., alkyl, cycloalkyl, etc.), and may include non-hydrocarbon functional groups of many types (e.g., esters, amides, ethers, ketones, halogens, etc.). Examples of functional groups which either react with SiH or interfere with hydrosilation catalysis are olefins reactive in hydrosilation, alcohols, sulfides, some amines and phosphines. $R_1$ is preferably a hydrocarbon radical having 1 to 2 carbon atoms. Structure (I) is the symmetrical isomer of tricyclopentadiene when $R_1$ is $CH_2$. $R_2$ is an aliphatic, aromatic or siloxy radical to which may be attached functionality that, under the hydrosilation conditions used, does not substantially react with SiH or carbon-carbon double bonds, or interfere with hydrosilation catalysis. Examples of aliphatic or aromatic groups useful as $R_2$ include substituted or unsubstituted alkyl, alkoxy, aryl, and aryloxy. Examples of siloxy radicals are dimethylsiloxy, tetramethyldisiloxy, phenylmethylsiloxy and cyclosiloxanes. $R_2$ may also be a non-hydrocarbon functional group, such as esters, amides, sulfones, sulfoxides, ketones, ethers, and oxygen. $R_2$ is preferably a hydrocarbon radical having 1 to 6 carbon atoms or a siloxy radical having 1 to 5 silicon atoms. The total molecular weight of the compound of formula (I), (II) or (III) is preferably less than 500. This component will be referred to as a "chain extender", herein.

Polycyclic polyenes that can be employed as the component (b) are polycyclic hydrocarbon compounds having at least two non-aromatic, non-conjugated carbon-carbon double bonds, which have different chemical reactivities, in their rings. By "having at least two chemically distinguishable carbon-carbon double bonds" it is meant that at least two carbon-carbon double bonds have widely different rates of reaction in hydrosilation and that one of the double bonds will react prior to substantial reaction of the other double bond(s). This first double bond must be quite reactive in hydrosilation. Reactive double bonds include those that are next to two bridgehead positions in a strained polycyclic aliphatic ring structure or in a cyclobutene ring. The other carbon-carbon double bond(s) may be any other non-aromatic, 1,2-disubstituted non-conjugated carbon-carbon double bond that is not next to two bridgehead positions in a strained polycyclic aliphatic ring structure and is not in a cyclobutene ring. Illustrative are certain isomers of cyclopentadiene oligomers having the general formula:

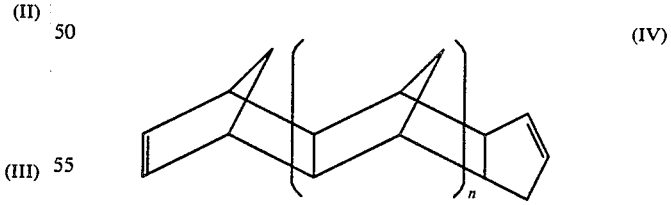

wherein n is 0, 1, 2 or 3 and substituted derivatives of these (substituents should not substantially interfere with the reactivity of the carbon-carbon double bonds in hydrosilation and, preferably, should not be on the carbon atoms of the double bonds). Compounds wherein n is 0 or 1 (i.e., dicyclopentadiene and the unsymmetrical isomer of tricyclopentadiene) are preferred.

Component (c) can be any cyclic polysiloxane with three or more hydrogen atoms bound to silicon. Mixtures of cyclic polysiloxanes are also useful. Cyclic polysiloxanes useful in forming the products of this invention include those having the general formula:

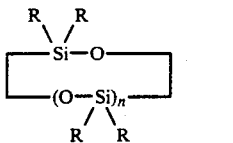

(V)

wherein R is hydrogen, or substituted or unsubstituted alkyl or aromatic radical, n is an integer from 3 to about 7, and R is hydrogen on at least three of the silicon atoms in the molecule.

Examples of reactants of Formula (V) include, e.g., tetra- and penta-methylcyclotetrasiloxanes, tetra-, penta-, hexa- and hepta-methylcyclopentasiloxanes, tetra-, penta- and hexa-methylcyclohexasiloxanes, tetraethyl cyclotetrasiloxanes and tetraphenyl cyclotetrasiloxanes. Preferred are 1,3,5,7-tetramethylcyclotetrasiloxane, 1,3,5,7,9-pentamethylcyclopentasiloxane and 1,3,5,7,9,11-hexamethylcyclohexasiloxane, or blends thereof.

The components (a), (b) and (c) are generally present in an amount such that:

$$0.5 \leq \frac{\text{moles of double bonds in (a) and (b)}}{\text{moles of SiH bonds in (c)}} \leq 1.8$$

and $$0.02 \leq \frac{\text{moles of double bonds in (a)}}{\text{moles of SiH bonds in (c)}} \leq 0.9.$$

Preferably, for printed circuit board applications they are in an amount such that:

$$0.7 \leq \frac{\text{moles of double bonds in (a) and (b)}}{\text{moles of SiH bonds in (c)}} \leq 1.3$$

and $$0.02 \leq \frac{\text{moles of double bonds in (a)}}{\text{moles of SiH bonds in (c)}} \leq 0.4.$$

And, most preferably for printed circuit board applications, they are in an amount such that:

$$0.9 \leq \frac{\text{moles of double bonds in (a) and (b)}}{\text{moles of SiH bonds in (c)}} \leq 1.2$$

and $$0.04 \leq \frac{\text{moles of double bonds in (a)}}{\text{moles of SiH bonds in (c)}} \leq 0.25.$$

The preferred ratio of each component depends on the specific components used and the amounts thereof. For instance, one feature of this invention is that by suitably advancing the prepolymers they are rendered substantially tack-free, making them desirable for fabrication of printed circuit boards using conventional techniques.

"Tack" means a sticky or adhesive quality or condition. "Substantially tack-free" prepregs, when placed in contact with each other under conditions of ambient temperature and pressure (e.g., when stored together), can be readily separated.

Generally, to obtain substantially tack-free prepregs, if component (b) is dicyclopentadiene and component (a) is 5-vinyl-2-norbornene, it is necessary that the ratio of double bonds in (a) and (b) to SiH bonds in (c) be greater than about 1.1:1, preferably in the range of 1.1:1 to 1.2:1. However, when the symmetrical isomer of tricyclopentadiene is used as component (a), dicyclopentadiene and the unsymmetrical isomer of tricyclopentadiene are used as component (b) (tricyclopentadiene is generally formed as a mixture of two isomers, the unsymmetrical isomer is a polycyclic polyene (b) and the symmetrical isomer is a chain extender (a)) and methylhydrocyclosiloxanes are used as component (c), non-tack can be achieved when the ratio of carbon-carbon double bonds to SiH bonds is in the range of 0.8:1 to 1.2:1, depending on the amount of tricyclopentadiene in the prepolymer (at a tricyclopentadiene level of about 15-35%, by weight of the prepolymer, the ratio of carbon-carbon double bonds to SiH bonds is preferably about 1:1).

Glass, carbon (graphite), quartz, aramid and other polymeric fibers are wetted very well by the liquid prepolymers, making them excellent matrix materials. Fiber can be in non-woven, unidirectional, woven, fabric, etc. form. They are especially well suited for impregnating glass or other fibers for printed circuit board applications. Generally, prepregs (and, thus, laminates and printed circuit boards made from such prepregs) contain from 25 to 65% by weight, of fibrous reinforcement, depending on the weave style. Fibers may be treated with a finish to enhance wetting and bonding of the prepolymer to the fiber.

Additives such as fillers and pigments are readily incorporated. Vermiculite, mica, wollastonite, calcium carbonate, sand, silica, fumed silica, ceramic beads, hollow glass, glass spheres, glass beads, ground glass, waste glass and other mineral fillers are examples of fillers which can be incorporated. Fillers can serve either as reinforcement or as fillers and extenders to reduce the cost. They can also be used for other reasons, such as viscosity modification. Fillers can be present in amounts up to about 15 weight % in glass fabric reinforced prepregs and in even higher amounts, i.e., up to about 85 weight %, when glass fibers are not used.

Another major advantage of the prepolymers of this invention is their flow properties. The presence of the chain extender (component (a)) in the formulation serves to raise the viscosity of the prepolymer. Without the chain extender, the resin viscosity would drop dramatically during prepreg fabrication and the prepolymer would drip off the reinforcement, resulting in inadequate resin content and/or poor prepreg quality. In addition, the presence of the chain extender decreases the flow of the prepolymer during lamination of the prepregs, ensuring sufficient resin in the final cured laminate.

Laminates made using the prepregs of this invention have several advantages over other compositions presently used for printed circuit boards. Due to the non-polar nature of the polymers formed, the electrical properties of the resulting laminates are outstanding, far superior to traditional epoxy and polyimide polymers. In addition, due to the non-polar nature of the polymer, laminates pick up little to no moisture during laminate and circuit board fabrication and use. Moisture pick-up is a serious problem with most materials used in printed circuit boards, both during board fabrication and in the performance of the final product. Since electrical properties can be affected by absorption of moisture, the electrical properties of the polymers of this invention are much more stable in humid environments than either epoxies or polyimides.

The prepolymers, prepregs, polymers, etc., are usually prepared with from 0.5 to 3.0 weight % of an antioxidant to protect the prepolymer from oxidizing during formation of the prepreg, during final cure, and also to protect the final product during use, for example, as a printed circuit board. Preferred are bis(1,2,2,6,6-pentamethyl-4-piperidinyl)-(3,5-di-tert-butyl-4-hydroxybenzyl)butylpropanedioate, (available as Tinuvin TM 144 from Ciba-Geigy Corp., Hawthorne, N.Y.) or a combination of octadecyl 3,5-di-tert-butyl-4-hydroxyhydrocinnamate (also known as octadecyl 3-(3',5'-di-tert-butyl-4'-hydroxyphenyl)propionate), available as Naugard TM 76 from Uniroyal Chemical Co., Middlebury, Conn.) and bis(1,2,2,6,6-pentamethyl-4-piperidinylsebacate) (available as Tinuvin 765 TM from Ciba-Geigy Corp.).

Incorporation of a low molecular weight elastomer improves the peel strength of the cured polymer when it is adhered to copper. Exemplary are ethylene-propylene-diene terpolymers, styrene-butadiene-styrene triblock rubber, styrene-butadiene rubber, polyisoprene, polybutadiene, natural rubber, styrene-isoprene-styrene triblock rubber, or saturated rubbers such as polyisobutylene and ethylenepropylene copolymer. Preferred is a low molecular weight ethylene-propylene-dicyclopentadiene terpolymer (Trilene 65 elastomer, Uniroyal Chemical Co.). Preferably, elastomer is used in an amount of 3 to 10%, preferably 5 to 7%, by weight for circuit board applications. Higher levels may be preferable for other applications.

The polymers, prepolymers, prepregs, etc., of this invention can be prepared using the hydrosilation techniques described by Leibfried in U.S. patent application Ser. Nos. 07/079,740 filed July 30, 1987 now U.S. Pat. No. 4,900,779 and 07/232,826 filed Aug. 16, 1988, now U.S. Pat. No. 4,902,731.

Generally, in the first steps of preparing prepregs for printed circuit board applications, a viscous liquid, semisolid or solid prepolymer is formed in a solvent by partially hydrosilating components (a), (b) and (c) in the presence of a hydrosilation catalyst until all of the more reactive double bonds (typically, half of the double bonds of the polycyclic polyene (b) and all of the double bonds in the chain extender (a)) are hydrosilated.

In one embodiment for preparing the prepolymer, a platinum-containing catalyst, preferably chloroplatinic acid, and a liquid polycyclic polyene are mixed and heated at 40° to 80° C. for one to two hours to form a platinum/olefin complex. The platinum/olefin complex solution is cooled to room temperature and then mixed with the other ingredients, i.e., cyclic siloxane, polycyclic polyene, chain extender, aliphatic hydrocarbon solvent and optional ingredients. This mixture is stirred at 20° to 40° C. in a water bath which serves as a heat sink. The level of solvent (from 5 to 50% by weight of the prepolymer solution), the catalyst level, and the temperature of the bath will all affect the rate of reaction. Conditions should be chosen such that the reaction temperature does not increase substantially above the bath temperature, as a sudden temperature rise may decrease the activity of the catalyst, which is needed for cure.

In a second embodiment, the polycyclic polyene-platinum catalyst complex can be mixed with solvent, polycyclic polyene, chain extender and optional ingredients. The mixture is heated to a temperature at which hydrosilation of reactive double bonds is facile, usually 40° to 80° C. Then, the cyclic siloxane is slowly dripped into the mixture.

In a third process, solvent is heated to 50° to 80° C. Then, the cyclic siloxane and antioxidant are dripped into the solvent simultaneously with the polycyclic polyene-platinum complex, polycyclic polyene and chain extender.

In the preferred process, the cyclic siloxane is mixed with solvent and antioxidant, and then heated to 50° to 80° C. The polycyclic polyene-platinum complex, polycyclic polyene, chain extender and optional ingredients are premixed and slowly dripped into the mixture.

The prepolymer (whose viscosity increases with the level of chain extender) is usually prepared in from 10 to 30%, by weight of the prepolymer, of a hydrocarbon solvent (e.g., hexane, heptane, octane, pentane, toluene, xylene, etc.) to make the prepolymer sufficiently fluid to coat the fibrous reinforcement evenly and with the proper amount of resin. Solvent can be added or stripped to obtain the desired viscosity.

According to one method for forming a prepreg, a prepolymer-solvent solution is poured into a container and reinforcement fibers, e.g., glass fabric is pulled through the resin solution. In order to ensure that the final product has a uniform coating, the impregnated glass fibers are then pulled through two bars separated by shims of, for example, 10–20 mils in thickness, to remove excess resin. The impregnated glass is then hung in an oven at an elevated temperature, typically about 120° to about 160° C. (at these temperatures the less reactive carbon-carbon double bonds are hydrosilated), for about 2 to about 5 minutes, after which it is removed and allowed to cool to a substantially tack-free prepreg comprising "the partial hydrosilation reaction product" of components (a), (b) and (c). When used to refer to a prepreg, "the partial hydrosilation reaction product" means that about 55 to about 75%, preferably about 60 to about 70% of the Si-H groups of the siloxanes are reacted.

Laminates are prepared from the prepregs by stacking individual plies of prepreg and laminating them under heat and pressure in a hydraulic press. Copper clad laminate can be made by placing copper foil next to the prepreg plies during the lamination step.

All of the hydrosilation steps are carried out using a hydrosilation catalyst, preferably a platinum containing catalyst. Typical platinum concentrations are from about 0.001 to about 0.05 weight percent, preferably 0.0025 to 0.03 weight percent, based on weight of the prepolymer. The preferred catalyst for hydrosilation, in terms of both reactivity and cost, is chloroplatinic acid ($H_2PtCl_6 \cdot 6H_2O$). Other platinum compounds can also be used to advantage in some instances, such as $PtCl_2$ and platinum metal on carbon. Commercially available platinum containing catalysts include PC072, PC075 and PC085, available from Hüls America, Bristol, PA (formerly called Petrarch).

This invention is illustrated in the following examples, which are illustrative and not intended to be limiting, wherein all parts, percentages, etc., are by weight and all weight percentages are based on the total weight of the prepolymer, unless otherwise specified.

CATALYSTS

Catalyst A

A 1,500 ppm chloroplatinic acid/dicyclopentadiene (CPA/DCPD) catalyst complex was prepared by sparging with nitrogen for five minutes in a glass container 0.150 parts CPA, and then, adding 100 parts DCPD and stirring at 50°-70° C. for one hour. Afterwards, the complex was allowed to cool to room temperature. This catalyst will be referred to as Catalyst A or CPA/DCPD catalyst complex.

Catalyst B

Catalyst B was a commercially available catalyst, PC075, from Hüls America.

EXAMPLE 1

This example demonstrates preparation of prepolymer, forming prepregs from the prepolymer, and making laminates from the prepregs.

Into a glass container were added, 53.4 parts methylhydrocyclosiloxanes (a mixture of predominantly 8, 10 and 12 membered siloxane rings) (MHCS), 40.6 parts dicyclopentadiene (DCPD), 10.4 parts 5-vinyl-2-norbornene, 1.11 parts Tinuvin TM 144 as an antioxidant, 36 parts hexane and 7.50 parts catalyst A (CPA/DCPD complex). The container was placed in a large 25° C. water bath (so that the temperature of the reaction mixture was maintained within the range of 1°-5° C. above bath temperature) and stirring was carried out until all the more reactive double bonds (half of the double bonds of the polycyclic polyene (b) and all of the double bonds in the chain extender (a)) were hydrosilated. Of the available SiH bonds, 22% reacted with the carbon-carbon double bonds of the chain extender (5-vinyl-2-norbornene).

The gel time of the resultant prepolymer solution was measured by placing 3-4 drops of the solution directly onto a 165° C. hot plate and stirring the solution with a wooden applicator stick until it gelled. It was found to be 4 minutes, 10 seconds.

The prepolymer solution was poured into a stainless steel container equipped with two bars above the container. The bars were separated by shims 12 mils thick. Glass fabric was pulled through the resin solution and between the bars to remove excess prepolymer. Next, the impregnated glass was hung in an oven at 150° C. for approximately 150-175 seconds, after which it was removed and allowed to cool. The resultant prepreg was substantially tack free and contained about 45% weight percent prepolymer.

Two four layer laminates were prepared by stacking prepregs between Teflon sheets and aluminum caul plates and placing the stack into a room temperature press at 1,000 pounds. The press was heated to 165° C., held for 1 hour, and, then, cooled. The laminates were then post-cured at 200° C. in a nitrogen sparged oven for 2 hours. The glass transition temperature (Tg) of the laminates, measured by a Rheometric Dynamic Spectrometer (Rheometrics Incorporated) was 132° C. Flex strengths ranged from 25 to 28 Kpsi (kilo (1000) pounds per square inch), and flex moduli ranged from 2.2 to 2.7 Mpsi (mega (1,000,000) pounds per square inch).

EXAMPLE 2

This example demonstrates preparation of prepolymer and forming prepregs from the prepolymer using the procedures of Example 1.

A prepolymer was prepared using 53.4 parts MHCS, 44.8 parts DCPD, 7.12 parts 5-vinyl-2-norbornene, 1.13 parts Tinuvin TM 144 as an antioxidant, 37 parts hexane and 7.5 parts catalyst A (CPA/DCPD complex). The gel point of the prepolymer was 4 minutes, 30 seconds at 161° C. Glass fabric coated with the prepolymer was substantially tack-free after heating for 3 minutes, 30 seconds at 161° C.

EXAMPLE 3

This example demonstrates preparation of prepolymer and forming prepregs from the prepolymer using the procedures of Example 1.

A prepolymer was prepared using 53.4 parts MHCS, 49.8 parts DCPD, 4.75 parts 5-vinyl-2-norbornene, 1.16 parts Tinuvin TM 144 as an antioxidant, 38 parts hexane and 7.7 parts catalyst A (CPA/DCPD complex). The gel point of the prepolymer was 5 minutes, 15 seconds at 155° C. Glass fabric coated with the prepolymer was substantially tack-free after heating for 3 minutes, 30 seconds at 160° C.

EXAMPLE 4

This example demonstrates preparation of prepolymer, forming prepregs from the prepolymer, and making laminates from the prepregs using the procedures of Example 1.

A prepolymer was prepared using 50 parts MHCS, 55 parts DCPD, 2.4 parts 5-vinyl-2-norbornene, 1.15 parts Tinuvin TM 144 as an antioxidant, 66 parts hexane and 7.7 parts catalyst A (CPA/DCPD complex). Some hexane was stripped to yield a 200 cps solution. The gel time of the resultant prepolymer was measured to be 7 minutes at 180° C.

Prepregs made from this prepolymer solution contained from 38-39 weight % prepolymer and were completely non-tacky. However, laminates made from these prepregs showed excessive flow, indicative of how such a low level of chain extender (5-vinyl-2-norbornene) gives insufficient molecular weight build up for proper flow during lamination.

EXAMPLE 5

This example demonstrates preparation of prepolymer, forming prepregs from the prepolymer, and making laminates from the prepregs using the procedures of Example 1.

A prepolymer was prepared using 53.4 parts MHCS, 44.4 parts DCPD, 11.3 parts m-diisopropenylbenzene, 1.17 parts Tinuvin TM 144 as an antioxidant, 39 parts hexane and 7.8 parts catalyst A (CPA/DCPD complex). Hexane was stripped until the viscosity was 250 cps. Substantially tack-free prepregs were prepared with heating for 3 minutes, 10 seconds at 132° C. The prepregs contained from 47-50 weight % of the prepolymer.

Lamination was carried out at 130° C., 300 psi for 1 hour. The laminates were post-cured for 2 hours at 200° C. and contained 46-50 weight % polymer. Glass transition temperature was 138° C. using a Rheometric Dynamic Spectrometer. Flexural strength and modulus were 28 Kpsi and 2.3 Mpsi, respectively.

EXAMPLE 6

This example demonstrates preparation of prepolymer and forming prepregs from the prepolymer using the procedures of Example 1.

A prepolymer was prepared using 36 parts MHCS, 35.4 parts DCPD, 6.3 parts diallyl ether, 0.78 parts Tinuvin TM 144 as an antioxidant, 19.6 parts hexane and 0.026 parts catalyst B. Gel time was measured to be 2 minutes, 37 seconds at 140° C. The resultant prepregs were slightly tacky.

EXAMPLE 7

This example demonstrates preparation of prepolymer, forming prepregs from the prepolymer and preparing a laminate from the prepregs using the procedures of Example 1.

A prepolymer was prepared using 90.0 parts MHCS, 76.7 parts DCPD, 29.8 parts cyclopentadiene trimer (5.1 parts symmetrical isomer, 24.7 parts unsymmetrical isomer), 1.97 parts Tinuvin TM 144 as an antioxidant, 22.1 parts hexane and 0.20 parts catalyst B. Once the prepolymer was made, an extra 0.10 parts of catalyst B were added to the prepolymer. Then, its gel time was measured to be 5 minutes, 15 seconds at 134° C.

Three different prepregs were prepared by heating the prepolymer on the glass fabric to 135° C. for 4 minutes, 5 seconds; 3 minutes, 35 seconds; and 2 minutes, 5 seconds, respectively, and all three were found to be substantially tack-free.

Laminates were prepared and post-cured at 220° C., for 4 hours. They were found to be of good quality (uniform appearance and adequate resin content). The Tg measured by a Rheometric Dynamic Spectrometer was 188° C. The Tg measured using a Thermal Mechanical Analyzer was 150° C. Flex strength was 29.0 Kpsi and flex modulus was 1.87 Mpsi.

EXAMPLE 8

This example demonstrates preparation of prepolymer, forming prepregs from the prepolymer and preparing a laminate from the prepregs using the procedures of Example 1.

A prepolymer was prepared using 86.8 parts MHCS, 25.2 parts DCPD, 76.6 parts cyclopentadiene trimer (13.0 parts symmetrical isomer, 63.6 parts unsymmetrical isomer), 1.9 parts Tinuvin TM 144 as an antioxidant, 48.3 parts toluene and 9.6 parts catalyst A. The prepolymer had a gel time of 4 minutes at 130° C.

Prepregs were prepared and found to be substantially tack-free. Then, laminates were prepared from the prepregs with post-cure at 220° C. for 4 hours. The Tg of the laminate as measured using a Rheometric Dynamic Spectrometer was 215° C. and as measured using a Thermal Mechanical Analyzer was 182° C. The 90° copper peel strength was 4.5-4.6 pounds per linear inch (pli).

EXAMPLE 9

This example demonsrates preparation of prepolymer and forming prepregs from the prepolymer using the procedures of Example 1.

A prepolymer was prepared using 150.0 parts MHCS, 55.6 parts DCPD, 140.3 parts cyclopentadiene trimer (23.9 parts symmetrical isomer, 116.4 parts unsymmetrical isomer), 1.13 parts Tinuvin TM 765 as an antioxidant, 5.55 parts Naugard TM 76 as an antioxidant, 92.3 parts toluene and 16.5 parts catalyst A. An additional 0.42 parts of catalyst B was added to the prepolymer prior to measuring its gel time and preparing prepregs. The gel time was measured to be 5 minutes at 130° C. Prepregs prepared from this prepolymer were substantially tack-free.

EXAMPLE 10

This example demonstrates preparation of prepolymer and forming prepregs from the prepolymer using the procedures of Example 1.

A prepolymer was prepared using 79.4 parts MHCS, 66.7 parts DCPD, 85.0 parts cyclopentadiene trimer (14.5 parts symmetrical isomer, 70.5 parts unsymmetrical isomer), 1.44 parts Tinuvin TM 765 as an antioxidant, 5.8 parts Naugard TM 76 as an antioxidant, 80.0 parts toluene, 11.7 parts catalyst A and 22.4 parts Trilene TM 65 Rubber. The gel time was measured to be 4 minutes 30 seconds at 130° C. Prepregs prepared from this prepolymer were substantially tack-free.

While the prepolymers and polymers of this invention are described with respect to printed circuit boards and prepregs for making printed circuit boards, it should be understood that they are also useful in many other applications, e.g., other composites, adhesives, encapsulants, potting compounds and coatings. A major advantage of the materials of this invention (containing a chain extender) in these applications is the ability to control molecular weight and viscosity.

While one major advantage of the prepolymers described herein is the ability to use them in the fabrication of prepreg materials which are substantially tack-free, they may also be used in the fabrication of tacky prepreg. The tackiness can be varied by controlling the degree to which the resin advances during prepreg fabrication, as well as by varying the composition. Tacky prepreg is often desired for fabrication of composite structures. These structures are commonly made by laying-up prepreg pieces to give the appropriate size and shape. The tackiness of the prepreg serves to hold the pieces in place during the lay-up operation. Once the structure is formed, it is generally cured under pressure at an elevated temperature.

Leibfried, in U.S. patent application Ser. Nos. 07/079,740 and 07/232,826, discloses that tricyclopentadiene can be used to prepare hydrosilation crosslinkable prepolymers and crosslinked polymers. Example 11 of Ser. No. 07/079,740, and Example 6 of Ser. No. 07/232,826 show prepolymers and polymers. It has been found that the cyclopentadiene trimer used in those examples contains both symmetrical and unsymmetrical isomers. The symmetrical isomer of this example is a chain extender per this invention. Also, in in U.S. patent application Ser. No. 07/079,740 Leibfried discloses use of norbornadiene, a chain extender per the instant invention. These patent applications, however, do not teach that components (a) and (b) per the instant invention should be used in combination or recognize the advantages of using such a combination, i.e., improved control over prepolymer viscosity and flow characteristics, preparing tack-free materials, etc. Thus, this invention is also directed to a crosslinkable prepolymer and crosslinked polymer made from components (a), (b) and (c), wherein the component group (a) does not include isomers of cyclopentadiene trimer, as well as the process of preparing such a polymer.

While the invention has been described with respect to specific embodiments, it should be understood that they are not intended to be limiting and that many variations and modifications are possible without departing from the scope of this invention.

What is claimed is:

1. A prepreg which comprises fiber reinforcment impregnated with the partial hydrosilation reaction product of:
   (a) at least one polyene having at least two non-aromatic carbon-carbon double bonds highly reactive in hydrosilation, the carbon-carbon double bonds being either in an alpha, beta or gamma position on a linear carbon moiety, next to two bridgehead positions in a strained polycyclic aliphatic ring structure, or in a cyclobutene ring;

(b) dicyclopentadiene and, optionally, one or more other polycyclic polyene having at least two chemically distinguishable non-aromatic, non-conjugated carbon-carbon double bonds in its rings;

(c) at least one cyclic polysiloxane containing three or more ≡SiH groups;

wherein about 55 to about 75% of the ≡SiH groups of the at least one cyclic polysiloxane (c) are reacted and the prepreg is substantially tack-free.

2. The prepreg of claim 1 wherein the one or more other polycyclic polyene (b) has two carbon-carbon double bonds and (i) the first double bond is next to two bridgehead positions in a strained polycyclic aliphatic ring or in a cyclobutene ring and (ii) the second double bond is 1, 2 disubstituted and is not next to two bridgehead positions in a strained polycyclic aliphatic ring structure and is not in a cyclobutene ring.

3. The prepreg of claim 1 wherein polyene (a) is selected from the group consisting of diallyl, divinyl and bis-norbornenyl compounds.

4. The prepreg of claim 1 wherein polyene (a) is selected from the group consisting of 5-vinyl-2-norbornene, o-, m- or p-diisopropenylbenzene, o-, m- or p-divinylbenzene, diallyl ether and diallyl benzene.

5. The prepreg of claim 1 wherein polyene (a) is selected from the group consisting of dimethanohexahydronaphthalene, and compounds having the following general formulae:

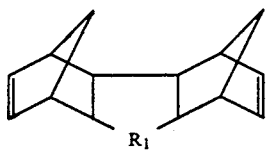

(I)

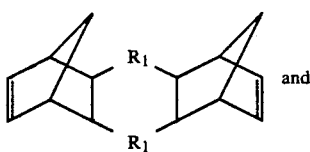

(II)

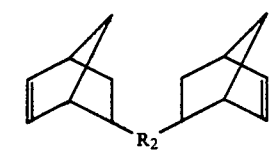

(III)

wherein $R_1$, which may be the same or different in formula (II), is selected from $C(R_3)_2$, $Si(R_3)_2$, $Si(R_3)_2$—$Si(R_3)_2$, $C(R_3)_2$—$C(R_3)_2$, $CON(R_3)$, $OC=O$, $C(R_3)=N$, $S=O$, $SO_2$, $O$ and $C=O$; $R_2$ is an aliphatic, aromatic or siloxy radical that during hydrosilation does not substantially react with SiH or carbon-carbon double bonds, or interfere with hydrosilation catalysis; $R_3$ is any substituent that during hydrosilation does not substantially react with SiH or carbon-carbon double bonds, or interfere with hydrosilation catalysis; and the total molecular weight of the compound is less than 500.

6. The prepreg of claim 5 wherein $R_2$ is selected from substituted or unsubstituted alkyl, alkoxy, aryl, aryloxy, siloxy, ester, amide, sulfone, sulfoxide, ketone, ether, or oxygen.

7. The prepreg of claim 6 wherein $R_3$ is selected from H; halogen; aromatic radicals; linear, cyclic or branched aliphatic radicals.

8. The prepreg of claim 6 wherein $R_3$ is H, Cl, Br, F or an alkyl, aryl, ester, amide, ether or ketone radical.

9. The prepreg of claim 1 wherein polyene (a) is the symmetrical isomer of tricyclopentadiene.

10. The prepreg of claim 1 wherein the one or more other polycyclic polyene (b) has the general formula:

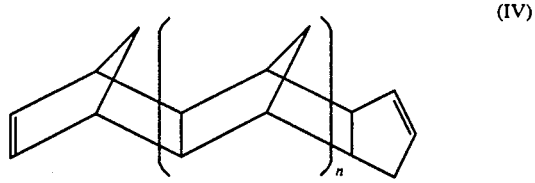

(IV)

wherein n is 1, 2 or 3.

11. The prepreg of claim 1 wherein the cyclic polysiloxane (c) has the general formula:

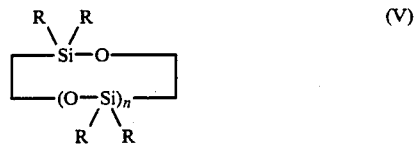

(V)

wherein R is hydrogen, a saturated, substituted or unsubstituted alkyl or alkoxy radical, a substituted or unsubstituted aromatic or aryloxy radical, n is an integer from 3 to about 20, and R is hydrogen on at least three of the silicon atoms in the molecule.

12. The prepreg of claim 1 wherein the cyclic polysiloxane (c) is selected from the group consisting of tetra- and penta-methylcyclotetrasiloxanes, tetra-, penta-and hexa-methylcyclopentasiloxane, tetra-, penta- and hexa-methylcyclohexasiloxane, tetraethyl cyclotetrasiloxane and tetraphenyl cyclotetrasiloxane.

13. The prepreg of claim 1 wherein the cyclic polysiloxane (c) is selected from the group consisting of tetra- and penta-methylcyclotetrasiloxanes, tetra-, penta-and hexa-methylcyclopentasiloxane, tetra-, penta- and hexa-methylcyclohexasiloxane.

14. The prepreg of claim 1 wherein:

$$0.5 \leq \frac{\text{moles of double bonds in (a) and (b)}}{\text{moles of SiH bonds in (c)}} \leq 1.8$$

and $$0.02 \leq \frac{\text{moles of double bonds in (a)}}{\text{moles of SiH bonds in (c)}} \leq 0.9.$$

15. The prepreg of claim 1 wherein:

$$0.7 \leq \frac{\text{moles of double bonds in (a) and (b)}}{\text{moles of SiH bonds in (c)}} \leq 1.3$$

and $$0.02 \leq \frac{\text{moles of double bonds in (a)}}{\text{moles of SiH bonds in (c)}} \leq 0.4.$$

16. The prepreg of claim 14 wherein polyene (a) is 5-vinyl-2-norbornene and polycyclic polyene (b) is dicyclopentadiene, and the ratio of double bonds in (a) and (b) to SiH bonds in (c) is in the range of 1.1:1 to 1.2:1.

17. The prepreg of claim 14 wherein polyene (a) is the symmetrical isomer of tricyclopentadiene and polycyclic polyene (b) comprises the unsymmetrical isomer of tricyclopentadiene and dicyclopentadiene, and the ratio of double bonds in (a) and (b) to SiH bonds in (c) is in the range of 0.8:1 to 1.2:1.

18. A laminate prepared by curing by hydrosilation at least two prepregs according to claim 1 beyond their gel point.

19. A laminate as claimed in claim 18 which is clad with conductive material.

20. A printed circuit board prepared from at least one laminate as claimed in claim 19.

21. A printed circuit board prepared from at least one prepreg as claimed in claim 1.

22. The prepreg of claim 1 wherein about 60 to about 70% of the $\equiv$SiH groups of the at least one cyclic polysiloxane (c) are reacted.

23. The prepreg of claim 2 wherein about 60 to about 70% of the $\equiv$SiH groups of the at least one cyclic polysiloxane (c) are reacted.

24. The prepreg of claim 14 wherein about 60 to about 70% of the $\equiv$SiH groups of the at least one cyclic polysiloxane (c) are reacted.

25. The prepreg of claim 1 wherein the polyene (a) has molecular weight less than 500.

26. The prepreg of claim 2 wherein the polyene (a) has molecular weight less than 500.

27. The prepreg of claim 23 wherein the polyene (a) has molecular weight less than 500.

28. The prepreg of claim 24 wherein the polyene (a) has molecular weight less than 500.

* * * * *